(12) United States Patent
Suzuki et al.

(10) Patent No.: US 10,409,224 B2
(45) Date of Patent: Sep. 10, 2019

(54) METHOD OF MANUFACTURING DECORATIVE MEMBER, DECORATIVE MEMBER, AND TIMEPIECE

(71) Applicant: CASIO COMPUTER CO., LTD., Shibuya-ku, Tokyo (JP)

(72) Inventors: Junichiro Suzuki, Kunitachi (JP); Kazuma Kobayashi, Fuchu (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 160 days.

(21) Appl. No.: 15/391,718

(22) Filed: Dec. 27, 2016

(65) Prior Publication Data

US 2017/0255166 A1 Sep. 7, 2017

(30) Foreign Application Priority Data

Mar. 1, 2016 (JP) ................................. 2016-038909

(51) Int. Cl.
| | | |
|---|---|---|
| *G04B 19/10* | (2006.01) | |
| *B29C 59/00* | (2006.01) | |
| *C23C 14/34* | (2006.01) | |
| *B29C 33/42* | (2006.01) | |
| *G04B 19/04* | (2006.01) | |
| *G04B 19/12* | (2006.01) | |
| *G04B 45/00* | (2006.01) | |
| *B29L 31/00* | (2006.01) | |

(52) U.S. Cl.
CPC .............. *G04B 19/10* (2013.01); *B29C 33/42* (2013.01); *B29C 59/002* (2013.01); *C23C 14/34* (2013.01); *G04B 19/042* (2013.01); *G04B 19/12* (2013.01); *G04B 45/00* (2013.01); *B29L 2031/722* (2013.01); *B29L 2031/739* (2013.01)

(58) Field of Classification Search
CPC ...... G04B 19/10; G04B 19/042; G04B 19/12; G04B 45/00
USPC .................................................. 368/232, 223
See application file for complete search history.

(56) References Cited

U.S. PATENT DOCUMENTS 3,486,322 A * 12/1969 Abend ................... G04B 19/26
368/21
4,579,460 A * 4/1986 Shannon .............. G04B 19/223
368/23
(Continued)

FOREIGN PATENT DOCUMENTS

CN 101801558 A 8/2010
CN 103180118 A 6/2013
(Continued)

OTHER PUBLICATIONS

Japanese Office Action dated Nov. 28, 2017 issued in counterpart Japanese Application No. 2016-038909.
(Continued)

*Primary Examiner* — Edwin A. Leon
(74) *Attorney, Agent, or Firm* — Holtz, Holtz & Volek PC

(57) ABSTRACT

A method of manufacturing a decorative member, including: molding a base with a mold having a transferring surface, the transferring surface having a recessed area and the other area, the recessed area and the other area having different surface roughnesses in the base in a finished state; and treating a surface of the base molded by the transferring surface of the mold under a single condition.

7 Claims, 3 Drawing Sheets

(56) References Cited

U.S. PATENT DOCUMENTS

| | | | | |
|---|---|---|---|---|
| 5,508,979 A | * | 4/1996 | Eisenegger | G04B 19/26 |
| | | | | 368/15 |
| 5,917,778 A | * | 6/1999 | James | G04B 19/22 |
| | | | | 368/17 |
| 9,126,255 B2 | | 9/2015 | Takayuki et al. | |
| 9,434,096 B2 | | 9/2016 | Yamashita et al. | |
| 2010/0206037 A1 | | 8/2010 | Takayuki et al. | |
| 2013/0216782 A1 | | 8/2013 | Yamashita et al. | |

FOREIGN PATENT DOCUMENTS

| | | | |
|---|---|---|---|
| JP | 51049059 A | 4/1976 | |
| JP | 11072576 A | 3/1999 | |
| JP | 2013252718 A | 12/2013 | |
| WO | 2012111773 A1 | 8/2012 | |

OTHER PUBLICATIONS

Chinese Office Action dated Jan. 3, 2019 (and English translation thereof) issued in counterpart Chinese Application No. 201710055762.5.

* cited by examiner

METHOD OF MANUFACTURING DECORATIVE MEMBER, DECORATIVE MEMBER, AND TIMEPIECE

CROSS-REFERENCE TO RELATED APPLICATIONS

The entire disclosure of Japanese Patent Application No. 2016-038909 filed on Mar. 1, 2016 including description, claims, drawings, and abstract are incorporated herein by reference in its entirety.

FIELD OF THE INVENTION

The present invention relates to a method of manufacturing a decorative member, a decorative member, and a timepiece.

DESCRIPTION OF RELATED ART

Various surface treatments have been carried out on members of interest to produce decorative members having beautiful appearances.

For example, Japanese Unexamined Patent Application Publication No. H11-72576 discloses a method of manufacturing exterior components that involves the formation of a fine pattern on the surface of an external case of a timepiece using an appropriate combination of various surface treatments, such as honing and etching.

A surface treatment, such as honing or etching, to a component requires application of a mask to portions not to be treated before the surface treatment and removal of the mask after the surface treatment.

In particular, a complicated surface treatment needs repetitions of the masking operation and the surface treatment.

Unfortunately, the repetitions of the masking operation and the surface treatment significantly increase the tasks in the manufacture. Particularly large tasks and long time are required in the surface treatments to a small decorative member, such as a dial or disk indicator of a watch, or a decorative member having a complicated shape. This problem results in a decrease in productivity and an increase in cost.

SUMMARY OF THE INVENTION

An object of the present invention is to provide a method of manufacturing a decorative member which can yield a decorative member having a sophisticated appearance comparable to that of a member fabricated by complicated surface treatments by a relatively simple technique, a decorative member, and a timepiece.

According to one aspect of the present invention, there is provided a method of manufacturing a decorative member, including: molding a base with a mold having a transferring surface, the transferring surface having a recessed area and the other area, the recessed area and the other area having different surface roughnesses in the base in a finished state; and treating a surface of the base molded by the transferring surface of the mold under a single condition.

BRIEF DESCRIPTION OF THE D WINGS

DETAILED DESCRIPTION OF THE PREFERRED EMBODIMENT

A method of manufacturing a decorative member and a timepiece equipped with a decorative member manufactured by this method according to an embodiment of the invention will now be described in detail with reference to FIGS. 1 to 3A-3C.

Although the following description includes various limitations to describe technically preferred embodiments of the invention, the embodiments and the illustrated examples should not be construed to limit the invention.

Figure 1:
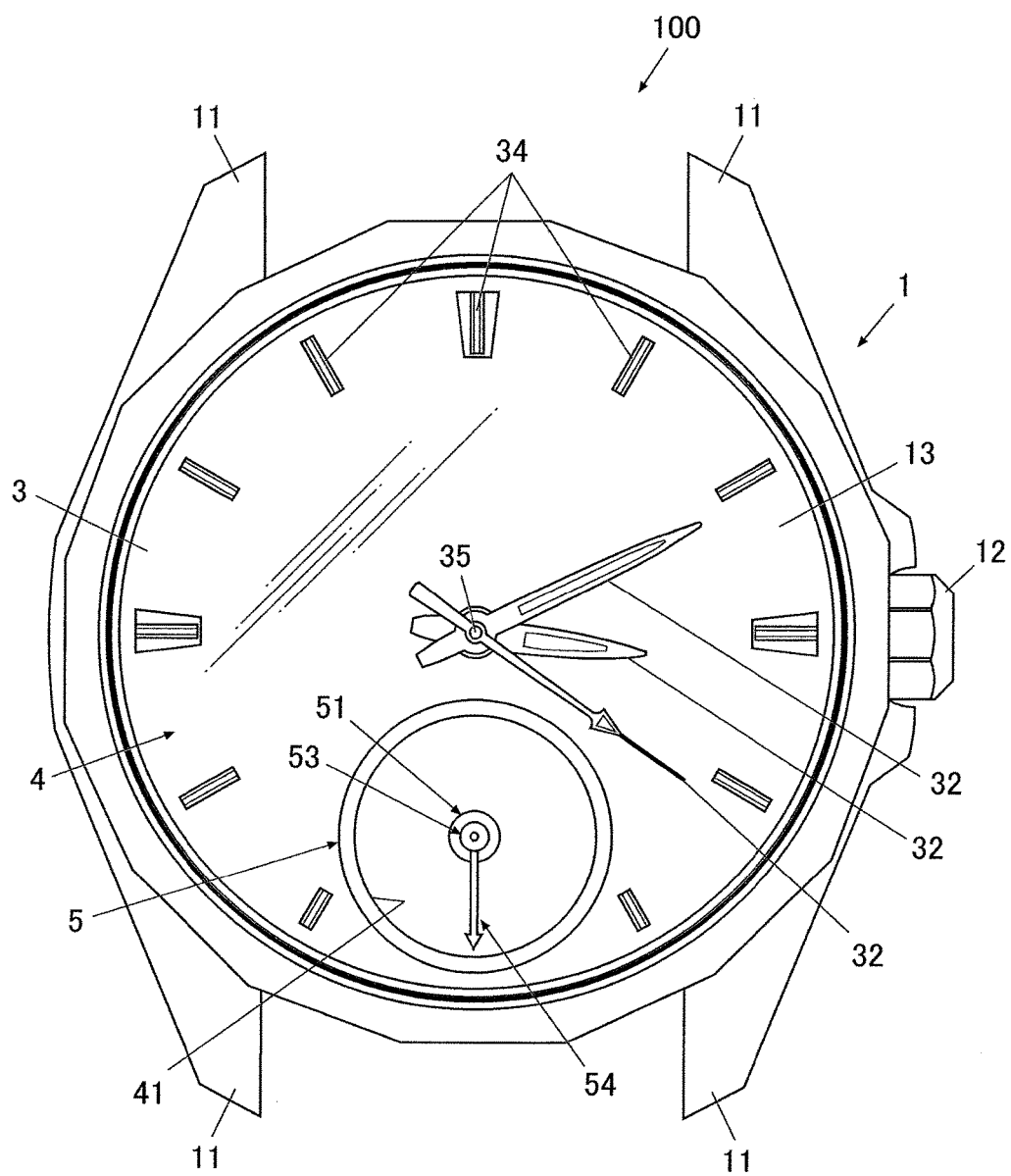
FIG. 1 is a front view of a timepiece including a decorative member according to an embodiment.

The description of the embodiments focuses on an example decorative member or the disk indicator 5 in FIG. 1.

The disk indicator 5 (decorative member) according to the embodiment is fabricated by molding resin with a mold having a variation in surface roughness from place to place corresponding to the difference in hue of the disk indicator 5 in the finished state to form a base (e.g., a base 5b in FIG. 3B) of the disk indicator 5, and applying a surface treatment to the base.

The mold in the embodiment is provided with a transferring surface 61 having a recessed area and the other area, which have different surface roughnesses in the base in the finished state, as described below. The recessed area of the transferring surface 61 is defined by, for example, the surface contour of the disk indicator 5.

The disk indicator 5 and its surface have any shape other than those of the illustrated example.

For example, the disk indicator 5 may be a flat plate or a substantial dome having a maximum height in the center and tapered toward the periphery.

Molds (an upper mold 6 and a lower mold 7 in FIGS. 2A to 2E) are prepared appropriately for the shape of the disk indicator 5.

Figure 2A:
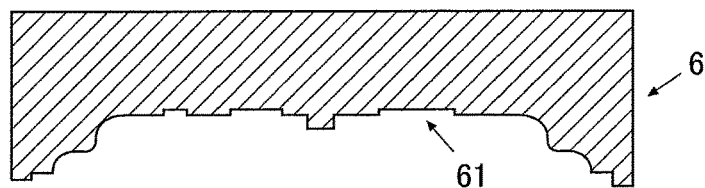
FIG. 2A is a cross-sectional view of an upper mold for molding a decorative member.
Figure 2B:
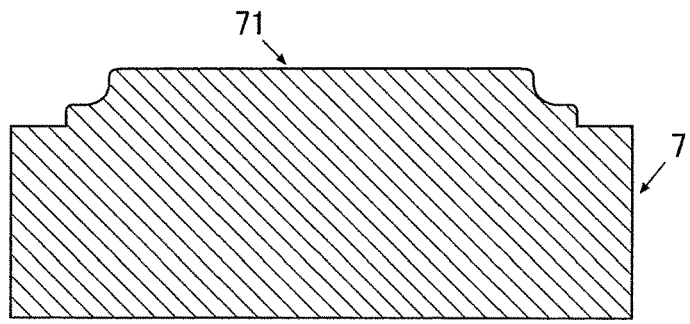
FIG. 2B is a cross-sectional view of a lower mold for molding a decorative member.
Figure 2C:
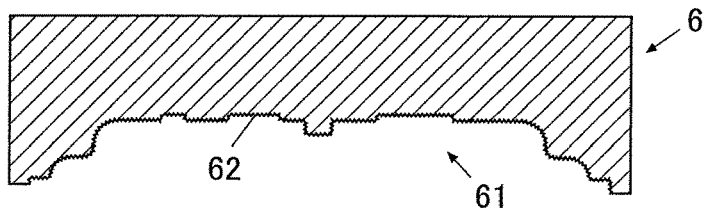
FIG. 2C is a cross-sectional view of an upper mold for molding a decorative member after a first process to the upper mold.
Figure 2D:
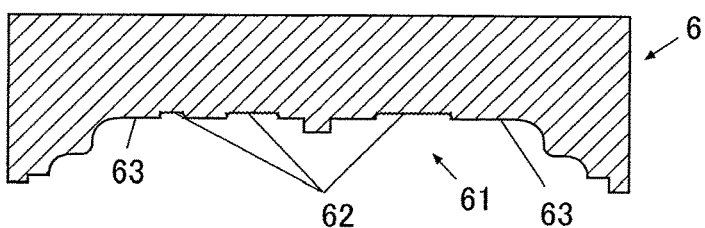
FIG. 2D is a cross-sectional view of an upper mold for molding a decorative member after a second process to the upper mold.

FIGS. 2A, 2C, and 2D are each a cross-sectional view of an upper mold for molding the base (e.g., the base 5b in FIG. 3B) of the disk indicator 5. FIG. 2B is a cross-sectional view of a lower mold for molding the base.

With reference to FIGS. 2A, 2C, and 2D, the upper mold 6 has a transferring surface 61 corresponding to the contour and pattern on the front surface of the disk indicator 5.

With reference to FIG. 2B, the lower mold 7 has a transferring surface 71 corresponding to the contour of the rear surface of the disk indicator 5.

Figure 2E:
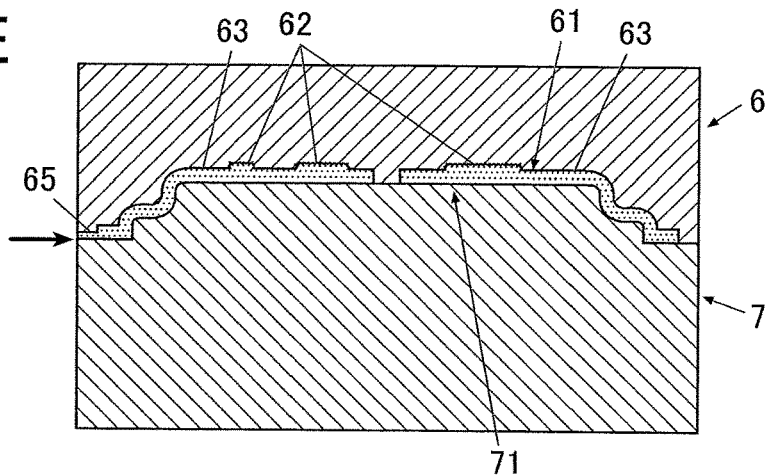
FIG. 2E is a cross-sectional view illustrating a process of molding a decorative member with molds.

With reference to FIG. 2E, the base of the disk indicator 5 is fabricated by placing the upper mold 6 onto the lower mold 7 in a proper relative position such that the transferring surface 61 faces the transferring surface 71, and injecting resin between the upper mold 6 and the lower mold 7 through a gate 65.

The upper mold 6 will now be described with reference to FIGS. 2A, 2C, and 2D.

FIG. 2A illustrates the upper mold 6 in the initial state provided with the transferring surface 61 having only the recesses and protrusions corresponding to the surface contour of the disk indicator 5.

In the embodiment, the entire transferring surface 61 of the upper mold 6 in the initial state having only the recesses and protrusions corresponding to the disk indicator 5 is subject to an embossing process (first process).

FIG. 2C is a schematic view of the upper mold 6 in FIG. 2A after the embossing process to the entire transferring surface 61.

The embossing process (first process) provides a texture representing the land, which is eventually left in part of the surface of the disk indicator 5 in the embodiment. In this step, the entire transferring surface 61 is turned into an embossed first area 62.

In the transferring surface 61 of the upper mold 6 after the first process, a mask is applied to an area (i.e., the recessed area in the embodiment, corresponding to a portion protruding from the surface of the disk indicator 5) to eventually remain as the embossed first area 62, and the other non-masked area is subject to a mirror finishing process (second process) in the embodiment.

FIG. 2D is a schematic view of the upper mold 6 in FIG. 2C after the mirror finishing process (second process) to the transferring surface 61 and the removal of the mask. These partial masking operation and second process leave the masked area (i.e., the recessed area) of the transferring surface 61 to be the embossed first area 62 and turn the other non-masked area into a mirror-finished second area 63.

Figure 3A:
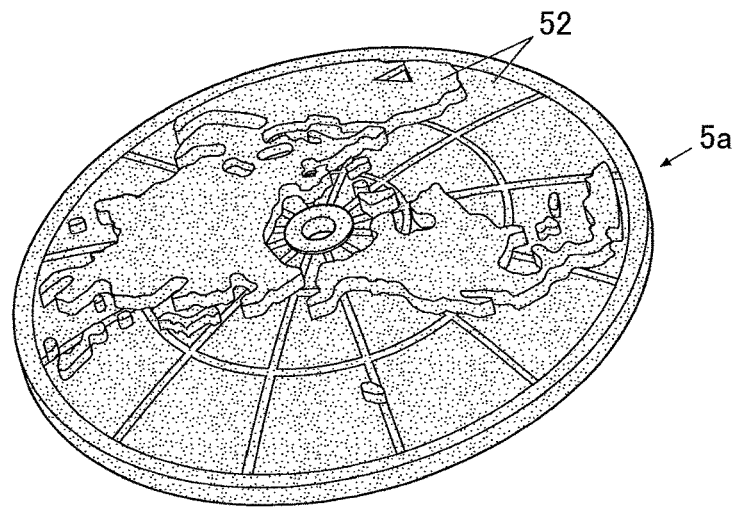
FIG. 3A is a perspective view of an example base molded with the upper mold in FIG. 2C.

FIG. 3A is a schematic view of an example base 5a of the disk indicator 5 fabricated by injecting resin between the upper mold 6 in FIG. 2C having the transferring surface 61 entirely occupied by the embossed first area 62 and the lower mold 7 in FIG. 2B.

With reference to FIG. 3A, the base 5a, molded with the upper mold 6 having the transferring surface 61 entirely occupied by the embossed first area 62, has a first texture portion 52 having a rough texture over the entire surface of the base 5a.

Figure 3B:
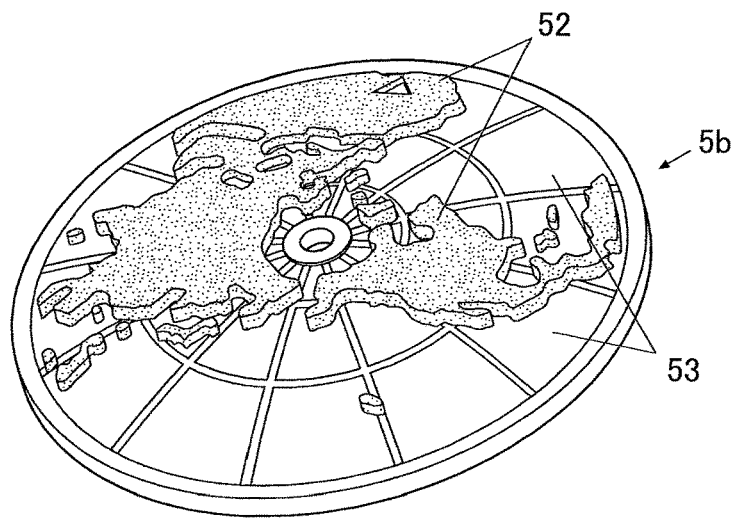
FIG. 3B is a perspective view of an example base molded with the upper mold in FIG. 2D.

FIG. 3B is a schematic view of an example base 5b fabricated by injecting resin between the upper mold 6 in FIG. 2D, having the transferring surface 61 provided with the embossed first area 62 in a part (i.e., the recessed area) and the mirror-finished second area 63 in the other part and the lower mold 7 in FIG. 2B.

With reference to FIG. 3B, the base 5b, molded with the upper mold 6 having the transferring surface 61 provided with the embossed first area 62 and the mirror-finished second area 63, has the first texture portion 52 having a rough texture only in the part corresponding to the first area 62 and a second texture portion 53 having a glossy and smooth texture in the other part corresponding to the second area 63.

In the embodiment, the base 5b in FIG. 3B is fabricated by resin molding with the upper mold 6 in FIG. 2D after the above two processes and the lower mold 7 in FIG. 2B. The transferred surface of the base 5b molded by the transferring surface of the mold (i.e., the surface facing the transferring surface 61 of the upper mold 6 in the embodiment) then undergoes a surface treatment under a single condition. A single surface treatment is applied to the base 5b in the embodiment and thus yields two hue portions, in which the number of hue portions is greater than the number of surface treatments.

Even if the surface treatment is conducted under a single condition to the base 5b, the base 5b in the finished state has different hues (e.g., brightness, density, and color tone) in different portions due to the difference in surface roughness of the base 5b after the surface treatment. For example, a portion having a lower surface roughness has a larger color density, whereas a portion having a higher surface roughness has a smaller color density.

Figure 3C:
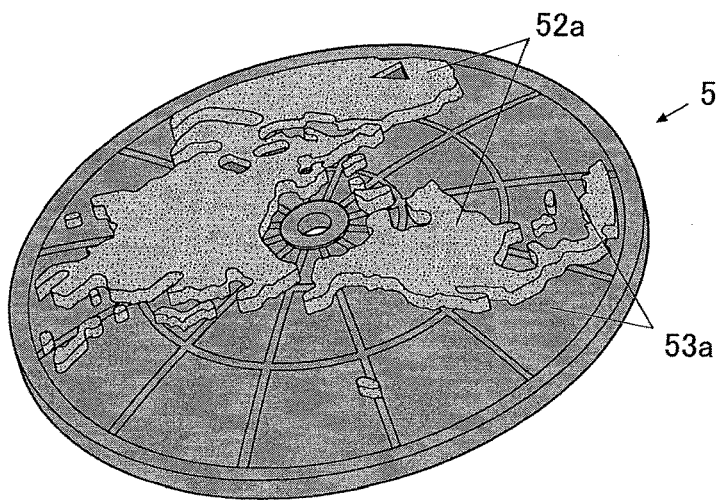
FIG. 3C is a perspective view of an example decorative member after a surface treatment.

For example, in the surface of the base 5b (in the embodiment, the surface facing the transferring surface 61 of the upper mold 6) in FIG. 3B, a single process of blue coating (a surface treatment) turns the first texture portion 52 having a high surface roughness into a first hue portion 52a having a small color density and turns the mirror-like second texture portion 53 having a low surface roughness into a second hue portion 53a having a large color density and a gloss, as illustrated in FIG. 3C.

The base 5b may undergo any surface treatment, such as sputtering or etching, other than the deposition.

A method of manufacturing the disk indicator 5 (decorative member) will now be explained according to the embodiment.

In the first step of the manufacture of the disk indicator 5, a mold is prepared that has a variation in surface roughness from place to place corresponding to the difference in hue of the disk indicator 5 in the finished state.

For example, the disk indicator 5 in FIG. 3C, having a surface consisting of a protruding portion having a rough texture and conveying the impression of the land and the other recessed portion having a glossy texture and conveying the impression of the ocean, is fabricated by the steps below.

With reference to FIG. 2A, the transferring surface 61 having recesses and protrusions corresponding to the contour of the front surface of the disk indicator 5 is formed on the upper mold 6 to define the contour of the front surface of the disk indicator 5.

With reference to FIG. 2B, the transferring surface 71 corresponding to the contour of the rear surface of the disk indicator 5 is formed on the lower mold 7 to define the contour of the rear surface of the disk indicator 5.

With reference to FIG. 2C, the entire transferring surface 61 of the upper mold 6 undergoes the embossing process (first process) to form the first area 62 having a high surface roughness.

Furthermore, a mask is applied to an area corresponding to the portion of the disk indicator 5 having a high surface roughness in the finished state (in the embodiment, the recessed area of the transferring surface 61 corresponding to the protruding portion (protruding area) of the disk indicator 5 to be finished with a rough texture). The other non-masked area then undergoes the mirror finishing process (second process).

These steps leave the masked area to be the first area 62 having a high surface roughness and generate the mirror-finished second area 63 having a low surface roughness, as illustrated in FIG. 2D.

After the preparation of the mold (the upper mold 6 in the embodiment) in FIG. 2D having a variation in surface roughness from place to place through the two processes, the base 5b is molded by placing the upper mold 6 onto the lower mold 7 and then injecting resin between the upper mold 6 and the lower mold 7 through the gate 65.

This step yields the base 5b that has a surface consisting of the first texture portion 52 having a rough texture and corresponding to the embossed first area 62 and the second texture portion 53 having a glossy texture and corresponding to the mirror-finished second area 63, as illustrated in FIG. 3B.

The molded base 5b then undergoes a single surface treatment, for example, a single process of blue coating onto the surface of the base 5b.

This step turns the first texture portion 52 of the base 5b into the first hue portion 52a having a small color density and rough texture and turns the second texture portion 53 into the second hue portion 53a having a large color density and smooth texture, and thus completes the disk indicator 5 (decorative member), as illustrated in FIG. 3C.

Thus, the pre-processes to vary the surface roughness of the mold (upper mold 6 in the embodiment) from place to place depending on the difference in hue of the disk indicator 5 in the finished state can provide different texture portions (the first texture portion 52 and the second texture portion 53 in the embodiment) to the base 5b molded with the mold. The surface treatment to this base 5b having different texture portions can form a greater number of hue portions (two hue portions in the embodiment, i.e., the first hue portion 52a and the second hue portion 53a) in the disk indicator 5 than the number of surface treatments (a single treatment in the embodiment).

A timepiece 100 equipped with the disk indicator 5 (decorative member) manufactured by the method according to the invention will now be described with reference to FIG. 1.

FIG. 1 is a front view of an example timepiece.

The timepiece 100 includes a case (hereinafter referred to as "timepiece case 1") having a hollow short columnar shape open in both ends in the thickness direction of the timepiece 100.

The opening of the timepiece case 1 on the viewer side (front side) adjacent to a viewer is closed with a windshield 13 composed of, for example, transparent glass. The opening of the timepiece case 1 on the rear side opposite to the viewer side is closed with a rear cover (not shown).

The timepiece case 1 is provided with band attachments 11 to be connected to timepiece bands (not shown) at the ends adjacent to the top and bottom of FIG. 1 or the ends at twelve and six o'clock of the timepiece 100.

The timepiece 100 further includes an operational button 12 on a side portion of the timepiece case 1.

An end of the operational button 12 is inserted in the timepiece case 1 and coupled to a timepiece module (not shown) accommodated in the timepiece case 1, such that a pushing or rotating operation to the operational button 12 can activate various functions.

The timepiece case 1 also accommodates a display unit 3 below the windshield 13.

With reference to FIG. 1, the display unit 3 according to the embodiment is of an analog system and includes a dial 4 and hands 32 (e.g., an hour hand, minute hand, and second hand) disposed above the dial 4.

Besides the analog system, the display unit 3 installed in the timepiece 100 may be of a digital system including a liquid crystal panel or of a combination of analog and digital systems.

With reference to FIG. 1, the dial 4 is a plate and has time marks 34 on the front surface along the periphery, which serve as guides for the time indication by the hands 32 (the hour hand, minute hand, and second hand).

The dial 4 also has an opening 41 approximately in the position at six o'clock of the timepiece 100. The opening 41 exposes the disk indicator 5 (decorative member) according to the embodiment. It should be noted that the pattern on the front surface of the disk indicator 5 is not illustrated in FIG. 1.

The disk indicator 5 is provided with an indicator shaft 51 approximately in the center. The disk indicator 5 is rotatable about the indicator shaft 51.

In detail, the proximal end (adjacent to the rear surface of the timepiece 100) of the indicator shaft 51 is coupled to the timepiece module. The timepiece module rotates the indicator shaft 51 and thus causes rotation of the disk indicator 5.

The disk indicator 5 is not necessarily exposed through the opening 41 of the dial 4. Alternatively, the disk indicator 5 may be superimposed on the dial 4, for example. In this case, no opening is required in the dial 4.

In the embodiment, the indicator shaft 51 is a hollow cylinder and surrounds a small-hand shaft 53 supporting a small hand 54.

The small-hand shaft 53 has a proximal end coupled to the timepiece module and a free end protruding from the front surface of the disk indicator 5. The protruding end of the small-hand shaft 53 is provided with the small hand 54.

The description of the embodiment focuses on an example small hand 54 supported by the small-hand shaft 53 and rotating above the disk indicator 5 to serve as a functional hand.

The small hand 54 is not an essential component. The configuration may include only the rotating disk indicator 5 without the small hand 54.

The timepiece case 1 also accommodates the timepiece module (not shown) below the display unit 3 (i.e., adjacent to the rear surface of the timepiece 100).

The timepiece module is equipped with a hand driving mechanism including a gear train and a motor in a resin housing (which are not shown), for example. The timepiece module also includes a circuit board having various electronic components and a battery for power supply to individual functional units of the timepiece 100.

The timepiece module is provided with a hand shaft 35 protruding toward the front side (viewer side) of the timepiece 100. The hand shaft 35 has a proximal end coupled to the hand driving mechanism and a free end (end in the protruding direction) extending through the dial 4 and exposed to the viewer side. The free end of the hand shaft 35 is provided with the hands 32 (the hour hand, minute hand, and second hand).

The timepiece module rotates the hand shaft 35, so that the hour hand, minute hand, and second hand coupled to the hand shaft 35 move above the dial 4.

The timepiece module is also provided with the indicator shaft 51 and the small-hand shaft 53 protruding toward the front side (viewer side) of the timepiece 100. The indicator shaft 51 and the small-hand shaft 53 each have a proximal end coupled to the hand driving mechanism and a free end (end in the protruding direction) extending through the disk indicator 5 and exposed to the viewer side.

The timepiece module rotates the indicator shaft 51, so that the disk indicator 5 coupled to the indicator shaft 51 moves above the dial 4. The timepiece module also rotates the small-hand shaft 53, so that the small hand 54 coupled to the small-hand shaft 53 moves above the disk indicator 5.

As described above, in the embodiment, the mold (the upper mold 6 in the embodiment) is prepared that has a variation in surface roughness from place to place corresponding to the difference in hue of the disk indicator 5 (decorative member) in the finished state.

In general, a variation in surface roughness from place to place is formed by masking a portion not to be treated and then performing a surface treatment. Another surface treatment requires another masking operation to a portion not to receive the other surface treatment. Unfortunately, the repetitions of such similar treatment steps to each molded product (base) significantly increase the tasks and time in the manufacture, resulting in a decrease in productivity. Even the mere application of masks and surface treatments may be hard for a small molded product or a product having a complicated shape.

In contrast, the molding of a product with the pre-processed mold requires masking operations and processes only in the preparation of the mold, leading to a reduction in the number of surface treatments to each molded product. This technique can thus significantly increase the productivity.

The application of pre-processes to the mold is easier than the repetitions of masking operations and surface treatments to decorative members molded with resin, resulting in an increase in operational efficiency.

The application of pre-processes to the mold can provide different texture portions to a base molded with the mold. The surface treatment to this base can form different hue portions corresponding to the respective texture portions, in which the number of hue portions is greater than the number of surface treatments. This relatively simple technique can thus yield a decorative member having a sophisticated appearance comparable to that of a member fabricated by complicated surface treatments.

The honing process to the mold (the upper mold 6 in the embodiment) can provide a rough texture portion in the embodiment, thereby achieving a wide variety of hues.

The mirror finishing process to the mold (the upper mold 6 in the embodiment) can provide a smooth texture portion in the embodiment, thereby achieving a glossy hue.

The surface treatment applied to the base is deposition or sputtering in the embodiment. The preparation of the base having various texture portions and the surface treatment, generally applied to resin products, to this base can produce a decorative member having a complex and beautiful appearance by relatively simple steps.

The timepiece equipped with this sophisticated decorative member can achieve a high level of design and beauty.

The above-described embodiments should not be construed to limit the invention and may be modified in various manners within the gist of the invention.

For example, the mold (upper mold 6) may be subject to any type of pre-process, other than the embossing and mirror finishing process illustrated in the embodiment. Any type of process applicable to the mold can be appropriately selected depending on the finished state required for the decorative member.

Although the two areas (the first area 62 and the second area 63 in FIG. 2D) are formed on the transferring surface (the transferring surface 61 in FIG. 2A) through the two pre-processes to the mold (upper mold 6) in the embodiment, any number of processes other than two processes can be applied to the mold.

For example, a non-processed area and a processed area on the transferring surface of the mold have mutually different states and can serve as two different areas. The technique thus requires at least one process to one of the transferring surfaces of molds.

Alternatively, three or more areas may be formed on the transferring surface (the transferring surface 61 in FIG. 2A) through three or more processes.

For example, as the number of applied embossing processes having various density of embossment increases, the number of areas formed on the transferring surface increases. In this case, it is preferred that the processes be sequentially applied in descending order of the surface roughness provided by the processes and a mask be applied to an area not to receive the subsequent process.

The base molded with the mold having three or more areas has three or more texture portions having different surface roughnesses. A single surface treatment to this base can thus yield a decorative member having three or more hue portions.

Although the base is subject to a single surface treatment in the embodiment, the number of surface treatments may be two or more, other than one.

For example, two surface treatments to the base, molded with the mold prepared through two processes and having two texture portions, can produce a decorative member having four hue portions, in which the number (four) of hue portions is greater than the number (two) of surface treatments.

In this case, the treatment steps involve applying the first surface treatment, masking a portion to be finished with the texture provided by the first surface treatment, and then applying the second surface treatment.

Various combinations of processes to the molds and surface treatments to the base molded with the molds can thus increase the number of hue portions in a decorative member, thereby yielding a more complex and sophisticated decorative member.

Although the decorative member fabricated by the method of manufacturing a decorative member is the disk indicator 5 in the embodiment, the method may be used to fabricate any member other than the disk indicator 5. In specific, the method according to the invention may be widely applied to members that are molded with molds and can receive surface treatments (e.g., dials and hands).

Although the first process and the second process are applied to only the transferring surface 61 of the upper mold 6 among the molds in the embodiment, the processes may be applied to the other mold than the upper mold 6. For example, the processes may be applied to the transferring surface 61 of the upper mold 6 and/or the transferring surface 71 of the lower mold 7, depending on the design of the decorative member.

Although the decorative member manufactured by the method of manufacturing a decorative member is installed in the timepiece 100 in the embodiment, the manufactured decorative member may be installed in any other device in which the decorative member can be disposed, other than the timepiece.

Though several embodiments of the present invention have been described above, the scope of the present invention is not limited to the above embodiments, and includes the scope of inventions, which is described in the scope of claims, and the scope equivalent thereof.

What is claimed is:

1. A decorative member comprising:
   a protruding portion on a front surface of the decorative member;
   a portion other than the protruding portion, on the front surface of the decorative member;
   a first texture portion provided only on the protruding portion; and a second texture portion provided on the portion other than the protruding portion;

wherein the decorative member has a disk shape;

wherein the decorative member is molded with a mold having a transferring surface, the transferring surface comprising a recessed area and an area other than the recessed area;

wherein the recessed area is recessed more than the area other than the recessed area;

wherein the recessed area is embossed and the area other than the recessed area is mirror-finished, such that only the area other than the recessed area is mirror-finished;

wherein the first texture portion is formed by the recessed area and has a higher surface roughness than the second texture portion, which is formed by the area other than the recessed area; and wherein the front surface of the decorative member is subject to a color surface treatment under a single condition.

2. A timepiece comprising the decorative member according to claim 1.

3. The decorative member according to claim 1, wherein the first texture portion comprises bosses having a predetermined size; and wherein the second texture portion is mirror-finished.

4. A method of manufacturing the decorative member according to claim 1, the method comprising:

molding a base with the mold having the transferring surface, the transferring surface comprising the recessed area and the area other than the recessed area; and treating a surface of the base molded by the transferring surface of the mold under the single condition.

5. The method according to claim 4, wherein the transferred surface of the base is treated by deposition or sputtering.

6. A decorative member comprising:

a protruding portion on a front surface of the decorative member;

a portion other than the protruding portion, on the front surface of the decorative member;

a first texture portion provided only on the protruding portion; and a second texture portion provided on the portion other than the protruding portion;

wherein the decorative member has a disk shape;

wherein the first texture portion has a higher surface roughness than the second texture portion;

wherein the front surface of the decorative member is subject to a color surface treatment under a single condition; and wherein the decorative member is a rotating member which is configured to rotate near a dial.

7. The decorative member according to claim 6, wherein the first texture portion comprises bosses having a predetermined size; and wherein the second texture portion comprises bosses having a size smaller than the predetermined size of the bosses in the first texture portion.

* * * * *